United States Patent [19]

Lenth et al.

[11] Patent Number: 5,038,352
[45] Date of Patent: Aug. 6, 1991

[54] LASER SYSTEM AND METHOD USING A NONLINEAR CRYSTAL RESONATOR

[75] Inventors: Wilfried Lenth, Capitola; William P. Risk, Mountain View, both of Calif.

[73] Assignee: International Business Machines Incorporation, Armonk, N.Y.

[21] Appl. No.: 612,721

[22] Filed: Nov. 13, 1990

[51] Int. Cl.$^5$ .............................................. H01S 3/10
[52] U.S. Cl. ...................................... 372/21; 372/20; 359/326
[58] Field of Search ...................... 372/21, 22, 92, 93; 307/424–427

[56] References Cited

U.S. PATENT DOCUMENTS 4,884,276 11/1989 Dixon et al. ......................... 372/21

OTHER PUBLICATIONS

M. K. Chun et al., Applied Physics Letters, Sep. 26, 1988, vol. 53, pp. 1170–1171, No. 13.
P. Gunter et al., Applied Physics Letters, Sep. 15, 1979, vol. 35, No. 6, pp. 461–463.
P. Gunter et al., Optics Communications, Dec. 1, 1983, vol. 48, No. 3, pp. 215–220.
W. J. Kozlovsky et al., IEEE Journal of Quantum Electronics, Jun. 1988, vol. 24, No. 6, pp. 913–919.
W. J. Kozlovsky et al., Optics Letters, Dec. 1987, vol. 12, No. 12, pp. 1014–1016.
A. Ashkin et al., "Resonant Optical Second Harmonic Generation and Mixing", IEEE J. Quantum Electronics, vol. QE-2, pp. 109–123, Jun. 1966.
P. W. Smith, Proceedings of the IEEE, Apr. 1972, vol. 60, No. 4, pp. 422–440.
G. J. Dixon et al., Optics Letters, Jul. 15, 1989, vol. 14, pp. 731–733.
B. Dahmani et al., Optics Letters, Nov. 1987, vol. 12, No. 11, pp. 876–878.

Primary Examiner—Georgia Epps
Attorney, Agent, or Firm—Douglas R. Millett

[57] ABSTRACT

A laser diode with a low reflectivity output facet provides infrared light to a nonlinear crystal resonator such that a portion of the infrared light is converted to blue light. A mirror is located on the opposite side of the nonlinear crystal resonator from the laser. The mirror allows the blue light to pass, but reflects the infrared light exiting the resonator back through the resonator and into the laser diode. The laser diode is thereby locked at the resonance frequency of the nonlinear crystal resonator.

21 Claims, 3 Drawing Sheets

LASER SYSTEM AND METHOD USING A NONLINEAR CRYSTAL RESONATOR

BACKGROUND OF THE INVENTION

1. Field of the Invention

This invention relates to laser systems, and more particularly, to laser systems for use in optical storage devices.

2. Description of the Prior Art

Semiconductor diode lasers are used in optical data storage systems. The gallium-aluminum-arsenide (GaAlAs) diode laser is one example and it generates light in the near infrared range (750-880 nanometers wavelength). The light from the laser is focused onto a spot on the optical disk in order to record each bit of data. The diameter of the spot is equal to approximately $\lambda/2(N.A.)$, where $\lambda$ is the wavelength of the light and (N.A.) is the numerical aperture of the lens which focuses the laser light. For a GaAlAs laser of 830 nm wavelength and a lens with a (N.A.) of approximately 0.5, the resulting spot size is 860 nanometers in diameter.

It is apparent that if the wavelength of the laser light can be cut in half, the diameter of the spot size will also be cut in half and the overall density of the optical disk will be quadrupled. Unfortunately, laser diodes which produce light in the blue range (430 nm in wavelength) are not yet available. Research in this area has concentrated on ways to convert the infrared light from the laser diode into blue light.

One technique to convert light to a higher frequency is known as second harmonic generation (SHG). Light is passed through a nonlinear crystal, such as potassium niobate ($KNbO_3$) and the second harmonic light (light at twice the frequency of the fundamental light) is generated. This SHG technique is discussed in the articles by M. K. Chun, et al., Applied Physics Letters, Sept. 26,1988, Vol. 53, No. 13, p. 1170; P. Gunter, et al., Applied Physics Letters, Sept. 15, 1979, Vol. 35, No. 6, p. 461; and by P. Gunter, et al., Optics Communications, Dec. 1, 1983, Vol. 48, No. 3, p. 215. However, the input power available for the diode lasers is low, unless additional optical enhancement techniques are used.

One way to increase the efficiency of the SHG scheme is to place an optical resonator around the nonlinear crystal. The light is reflected back and forth through the crystal inside the resonator in order to generate a substantial amount of the blue light. This technique is described by W. J. Kozlovsky, et al., IEEE Journal of Quantum Electronics, June 1988, Vol. 24, No. 6, p. 913; W. J. Kozlovsky, et al., Optics Letters, December 1987, Vol. 12, No. 12, p. 1014; A. Ashkin, et al., "Resonant Optical Second Harmonic Generation and Mixing," IEEE J. Quantum Electronics, QE-2, 109-123, (1966); and by P. W. Smith, Proceedings of the IEEE, April 1972, Vol. 60, No. 4, p. 422. The disadvantage of this scheme is that the frequency of the laser must be precisely tuned to the resonant frequency of the resonator (otherwise known as a passive cavity) and must somehow be stabilized so that it remains locked to the resonator cavity resonance at all times. The laser frequency must be stable to within a fraction of the width of the resonance of the passive cavity.

For example, assume that there is a nonlinear resonator with an effective length (including refractive-index contribution of the nonlinear crystal) of 1.5 centimeters, then the resonator cavity mode spacing is equivalent to 10 gigahertz. A finesse of approximately 100 is needed to build up high circulating power and the linewidth of the resonance will be approximately 100 megahertz. For efficient frequency second harmonic generation, the laser must be frequency locked to within an accuracy of less than approximately 20 megahertz, which is comparable to the intrinsic linewidth of diode lasers.

The laser may be actively locked to the resonant frequency by means of an electronic detection and feedback circuit. This greatly increases the complexity of the system. The laser may alternatively be passively locked to the resonant frequency. If light at the resonant frequency is directed back into the laser, the laser can stabilize its frequency to that of the resonant frequency. See the article by B. Dahmani, et al., Optics Letters, November 1987, Vol. 12, No. 11, p. 376.

A paper by G. J. Dixon, et al., Optics Letters, July 15, 1989, Vol. 14, No. 14, p. 731, teaches a SHG system using passive laser locking. The Dixon device uses an angled mirror at the exiting end of the nonlinear crystal resonator to separate a small portion of the fundamental frequency light from the second harmonic frequency light. This small portion of the fundamental frequency light is then reflected back around the nonlinear crystal resonator and into the laser via a ½ wave plate, a second mirror, a polarizing beam splitter, and a magneto-optical isolator. The laser is thereby effectively locked at the resonant frequency of the nonlinear crystal resonator. U.S. Pat. No. 4,884,276 by G. J. Dixon, et al. teaches another SHG system which uses optical feedback. Both of these systems require that the feedback light be precisely controlled so that it is in phase with the laser light field. What is needed is a laser SHG system with optical feedback having a minimum number of optical parts.

SUMMARY OF THE INVENTION

In accordance of the present invention, a laser diode provides infrared radiation which is to be converted to the second harmonic radiation by frequency doubling. A nonlinear crystal is placed inside an optical resonator so that the high intracavity power will permit efficient second harmonic generation. Appropriate collimation and focussing optics are used to couple the laser output to the resonator. A feedback mirror reflects the light transmitted directly back through the resonator and into the laser. The front facet of the diode laser is antireflection coated (having reflectivity of 5% or less) and the external optical feedback results in efficient lasing at a wavelength equal to the resonance wavelength of the nonlinear crystal resonator.

For a fuller understanding of the nature and advantages of the present invention reference should be made to the following detailed description taken in conjunction with the accompanying drawings.

DESCRIPTION OF THE PREFERRED EMBODIMENTS

Figure 1:
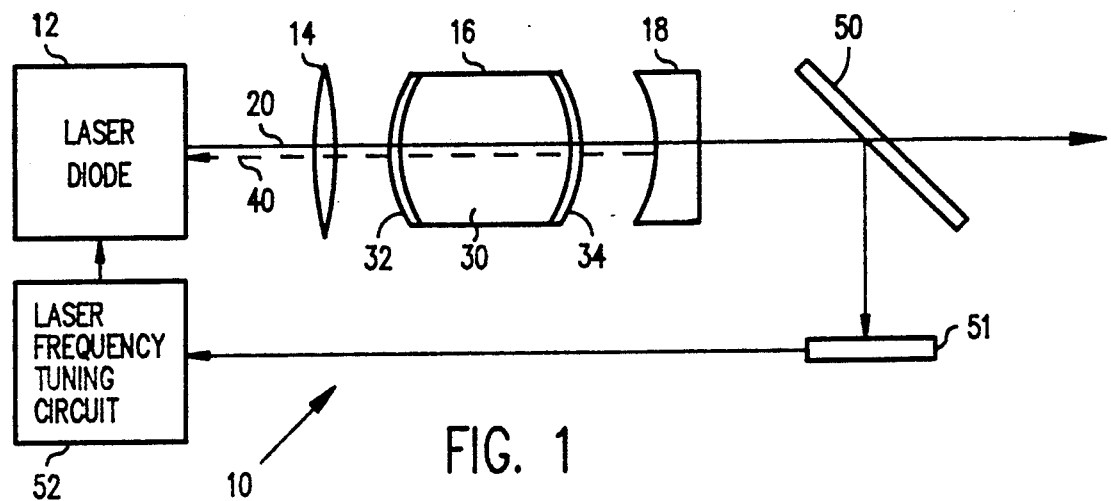
FIG. 1 shows a schematic diagram of the laser system of the present invention.

FIG. 1 shows a laser system of the present invention and is designated by the general reference number 10. System 10 comprises a laser diode 12. Laser 12 may be a GaAlAs laser diode which generates light at approximately 860 nanometers wavelength. The laser diode has an anti-reflective coating on its output facet to achieve a reflectivity of 5% or less and preferably less than 1%. Anti-reflective coatings such as zirconia or alumina films or multi-layer films or their equivalents may be used.

A lens 14, a nonlinear crystal optical resonator 16 and a concave mirror 18 are all aligned along an output line 20 of laser 12. As an alternative to mirror 18, a combination of a lens and a flat mirror may be used. Resonator 16 comprises a nonlinear crystal 30 which is surrounded by a resonator input mirror 32 and a resonator output mirror 34. The crystal 30 may be a potassium niobate ($KNbO_3$) crystal. Resonator 16 is designed to have a resonance frequency equal to the frequency of the laser diode 12. In the preferred embodiment crystal 30 is approximately 3-10 mm in length. The crystal 30 is preferably temperature controlled to the current phase matching temperature with a thermo-electric element or a resistance heater (not shown). The phase matching temperature depends upon the type of nonlinear crystal and the frequency of the light. For $KNbO_3$ and frequency doubling of 860 nm light the temperature is approximately 23° C.

Mirror 32 is highly reflective (greater than 90%) for the second harmonic light (blue light at 430 nm wavelength, for example). Mirror 32 has a reflectivity R1 for the fundamental frequency light from laser 12 (infrared light at 860 nm wavelength, for example). The reflectivity R1 is chosen such that resonator 16 will impedance match the laser 12, so that the light reflected back toward laser 12 directly from mirror 32 is minimized and the coupled light (light which is trapped in resonator 16) is maximized. A more detailed description of impedance matching is given in the article by W. J. Kozlovsky, et al., "Efficient Second harmonic Generation of a Diode-Laser-Pumped Cd Nd:YAG Laser," IEEE J. Quantum Electronics, Vol. QE-24, No. 6, p. 913, (1988). Mirrors 32 and 34 have their reflective surfaces facing the crystal 30.

Mirror 34 has a reflectivity of less than or equal to 85% for fundamental frequency (FF) light (infrared light) and a transmission of greater than 95% for second harmonic (SH) light (blue light). Mirror 18 has a reflectivity greater or equal to 99% for FF (infrared) light and a transmission of equal to or greater than 95% for SHG (blue) light. Mirrors 18, 32 and 34 are made of a multi-layer dielectric coatings as are known in the art. The layers may be made of $SiO_2$ and $TiO_2$ in alternating layers. Mirrors 32 and 34 may be coatings which are deposited directly onto crystal 30. However, separate mirrors on either side of crystal 30 may be used.

A beamsplitter 50 is positioned along line 20 to reflect a small fraction of the SHG light (blue light) which passes through mirror 18 to a photodetector 51. Detector 51 is connected to a laser frequency tuning circuit 52 and provides circuit 52 with a signal proportional to the amount of SHG light received at photodetector 51. Circuit 52 is connected to laser 12.

The operation of system 10 may now be understood. Laser diode 12 generates a beam of fundamental frequency light (infrared light) which is sent along line 20 to lens 14. Lens 14 images the light from laser 12 onto the input mirror 32 of the resonator 16. The FF (infrared) light is then reflected back and forth inside resonator 16 and some of this light is converted to SHG (blue) light. Lens 14 focuses the light in such a way that the light entering resonator 16 will spatially mode match the light which is already being reflected back and forth inside the resonator 16. Spatial mode matching is discussed in more detail in the article "Laser Beams and Resonators," *Applied Optics*, Vol. 5, pp. 1550-1567, October 1966.

The SHG (blue) light is allowed to exit resonator 16 and passes readily through mirror 18. The remaining FF (infrared) light which exits resonator 16 is reflected backwards by mirror 18 along line 20 through resonator 16 and lens 14. The reflected FF (infrared) light is represented by a dotted line 40. The threshold of laser 12 is lowest when the feedback light along line 40 is at a maximum. This maximum will occur when the laser 15 frequency coincides with the resonator frequency. As a result, the feedback light frequency matches the laser diode 12 to the resonance frequency of resonator 16.

A high circulating field is built up inside the resonator 16. However, it is necessary to maintain the laser wavelength within the phasematching bandwidths of the SHG process. Phasematching bandwidth are on the order of 0.1-2 nm (30-600 GHz) and the relatively course frequency stabilization is provided by the tuning circuit 52. Tuning circuit 52 may use either temperature and/or current tuning of laser 12. As an alternative, the temperature of crystal 30 can be controlled with a tuning circuit so that the phasematching wavelength coincides with the laser wavelength. Laser wavelength variations which occur due to aging and/or temperature effects which occur at a very slow rate. Accordingly, the tuning circuit 52 does not require a fast response time and a very simple type of tuning circuit may be used. A SHG (blue) light monitor detector will generally be part of any optical storage drive.

Figure 2:
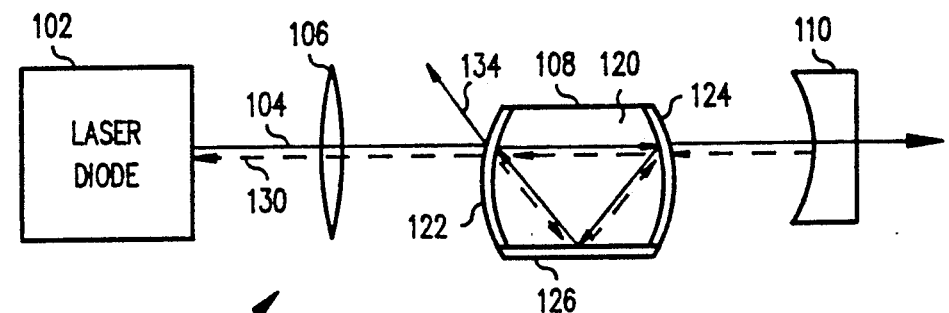
FIG. 2 shows a schematic diagram of an alternative embodiment of the present invention.

FIG. 2 shows a second embodiment of the laser system of the present invention and is designated by the general reference number 100. System 100 comprises a laser diode 102 similar to laser 12 of FIG. 1. Laser 102 outputs a beam of FF (infrared) light along an output line 104. A lens 106, a three mirror ring resonator 108 and a feedback mirror 110 are all positioned along line 104. Resonator 108 comprises a nonlinear crystal 120 which is similar to crystal 30 of FIG. 1.

Crystal 120 is surrounded by a mirror 122, a mirror 124 and a polished surface 126. Mirror 122 is chosen to be highly reflective (greater than 90%) for the SHG light and to have a reflectivity R1 for FF light. The reflectivity R1 is chosen such that resonator 108 will impedance match the laser 102, so that the light reflected back toward laser 102 directly from mirror 122 is minimized and the coupled light (light which is trapped in resonator 108) is maximized. Mirrors 110 and 124 both have reflectivity of equal to or greater than 99% for FF (infrared) light and a transmission of equal to or greater than 95% for SHG (blue light). Polished surface 126 achieves total internal reflectance because the geometry of resonator 108 is such that the internal light hitting surface 126 is at an angle relative to the normal of the surface of greater than the critical angle for the material. For KTP the critical angle is approximately 60°. Alternatively, surface 126 may be a highly reflective mirror. The mirrors are made of multi-layer dielectric coatings. The mirrors 122, 124 and surface 126 are arranged to provide internal reflection of light through crystal 120 in a triangle or ring pattern.

In operation, FF (infrared) light from laser 102 is focused by lens 106 onto mirror 122 of resonator 108. The light is spatially mode matched to the light already inside resonator 108. The light is then reflected around the three mirrors 122, 124 and 126 in a clockwise direction. Both FF (infrared) and SHG (blue) light exit resonator 108 at mirror 124. At mirror 110, the SHG (blue) light is allowed to pass through and the FF (infrared) light is reflected back into resonator 108. This reflected FF (infrared) light is then reflected around 122, 124 and 126 in a counterclockwise direction. Some of this reflected FF (infrared) light exits 108 at mirror 122 and is directed back into laser 102. The laser 102 is then frequency matched to the resonance frequency of resonator 108. A dotted line 130 represents the feedback path of the FF (infrared) light.

An advantage of system 100 is that FF (infrared) light is not reflected directly back from mirror 122 into laser 102. In system 10 of FIG. 1, some of the light from laser 12 may be reflected directly back into laser 12 from the external surface of mirror 32 without ever entering the resonator 16. This directly reflected light, although minute, may interfere with the frequency locking of laser 12. System 100 solves this problem by using the three mirror ring resonator 108. Here the light from laser 102 which is directly reflected off of the external surface of mirror 122 is reflected off at an angle away from laser 102 along a line 134. The laser 102 only receives the reflected FF (infrared) light from resonator 108 which locks it at the resonance frequency and does not receive any interfering light.

Figure 3:
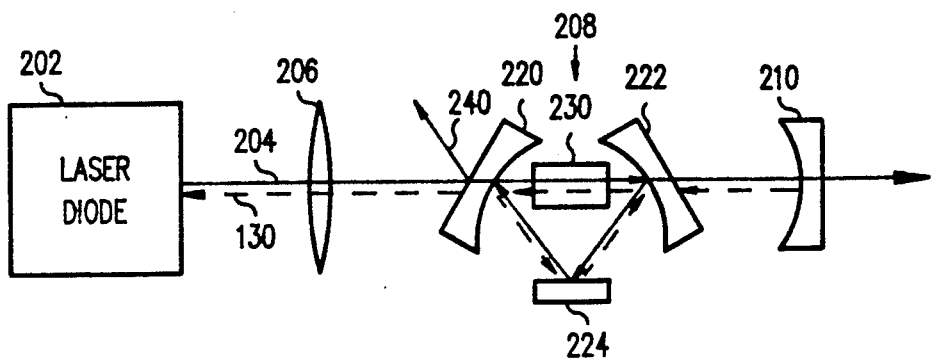
FIG. 3 shows a schematic diagram of an alternative embodiment of the present invention.

FIG. 3 shows a third embodiment of the laser system of the present invention and is designated by the general reference number 200. System 200 comprises a laser diode 202 similar to laser 12 of FIG. 1. Laser 202 outputs FF (infrared) light along a line of output 204. A lens 206, a three mirror ring resonator 208 and a feedback mirror 210 are all positioned along line 204. Resonator 208 comprises three mirrors 220, 222 and 224 arranged in a ring configuration. Mirror 220 is chosen to be highly reflective (greater than 90%) for the SHG light and to have a reflectivity R1 for the FF light. The reflectivity R1 is chosen such that resonator 208 will impedance match laser 202, so that the light reflected back toward laser 202 directly from mirror 220 is minimized and the coupled light (light which is trapped in resonator 208) is maximized. Mirrors 210 and 222 have a reflectivity of equal to or greater than 99% for FF (infrared) light and a transmission of 95% for SHG (blue) light. Mirror 224 has a reflectivity equal or greater than 99% for both FF (infrared) and SHG (blue) light. These mirrors are made by a multi-layer dielectric coating process. A nonlinear crystal 230 is positioned along line 204 between mirrors 220 and 222. Crystal 230 is similar to crystal 30 of FIG. 1.

The operation of system 200 is very similar to that of system 100 of FIG. 2. In system 200 FF (infrared) light from laser 202 is focussed by lens 206 onto mirror 220 to spatially mode match the light inside resonator 208. Light which does not pass through mirror 220 is reflected along a line 240 away from a laser 202. The light which passes through mirror 220 is reflected around resonator 208 in a clockwise direction. The FF (infrared) and SHG (blue) light exit resonator 208 at mirror 222. Mirror 210 passe the SHG (blue) light and reflects 222. the FF (infrared) light back into resonator 208. This reflected FF (infrared) light reflects around resonator 208 in a counter-clockwise direction and exits resonator 208 at mirror 220. This reflected FF (infrared) light then passes into laser 202 and frequency matches laser 202 at the resonance frequency of resonator 208.

Figure 4:
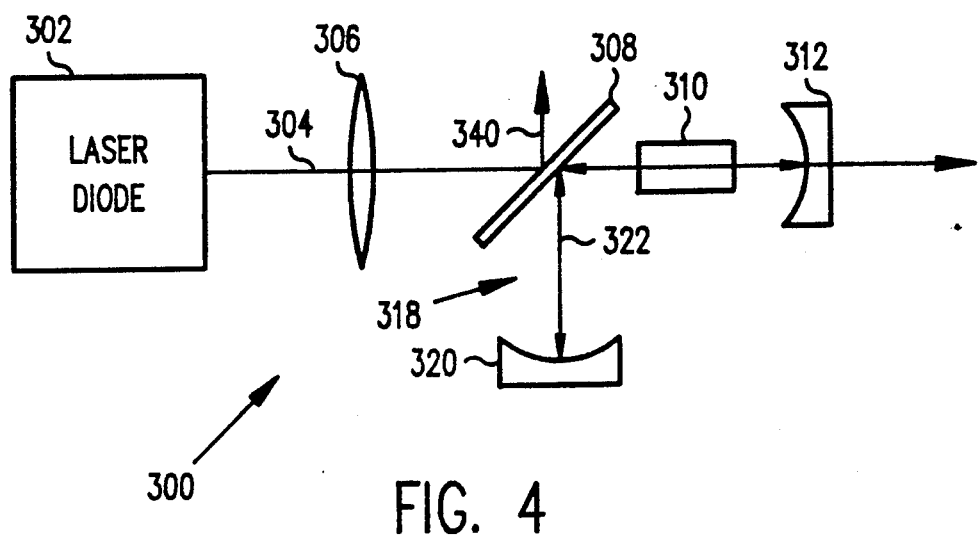
FIG. 4 shows a schematic diagram of an alternative embodiment of the present invention.

FIG. 4 shows a fourth embodiment of the laser system of the present invention and is designated by the general reference number 300. System 300 comprises a laser diode 302 similar to laser 12 of FIG. 1. Laser 302 outputs FF (infrared) light along an output line 304. A lens 306, a beam splitter 308, a nonlinear crystal 310 and a concave feedback mirror 312 are all positioned along line 304. Crystal 310 is similar to crystal 30 of FIG. 1. Beam splitter 308, mirror 312 and concave mirror 320 comprise a resonator 318. Beam splitter 308 is chosen to be highly reflective (greater than 90%) for the SHG light and to have a reflectivity R1 for the FF light. The reflectivity R1 is chosen such that resonator 318 will impedance match laser 302, so that the light reflected directly back from beam splitter 308 is minimized and the coupled light (light which is trapped in resonator 308) is maximized. Mirror 312 has a reflectivity of equal to or greater than 99% for FF (infrared) light and a transmission of equal to or greater than 95% for SHG (blue) light.

Concave mirror 320 is positioned along line 322 perpendicular to line 304 from beam splitter 308. Mirror 320 has a reflectivity of equal to or greater than 99% for both FF (infrared) and SHG (blue) light.

In operation, laser 302 generates a beam of FF (infrared) light along line 304. This FF (infrared) light is focussed by lens 306 onto beam splitter 308 to spatially mode match the light inside resonator 318. Beam splitter 308 reflects a portion of the light along a line 340. The remaining portion of the light passes through beam splitter 308 and crystal 310 to mirror 312. Mirror 312 passes the SHG (blue) light and reflects back the FF (infrared) light. This reflected FF (infrared) light passes through crystal 310 to beam splitter 308. Beam splitter 308 allows a portion of this reflected FF (infrared) light to pass through the beam splitter 308 back into laser 302. The remaining portion of the FF (infrared) light is reflected towards mirror 320, which in turn reflects the light back to beam splitter 308. The FF (infrared) light which is passed back through beam splitter 308 to laser 302 and frequency matches the laser 302 to the resonance frequency of the resonator 318. The light reflected back from mirror 312 into laser 302 has a dominant maximum on resonance. In the off-resonance condition, the optical feedback is weak and is equal to $(T/(2+T))^2$ where T is the transmission of beam splitter 308 and it is assumed that mirror 312 and 320 have reflection coefficients approaching unity.

Figure 5:
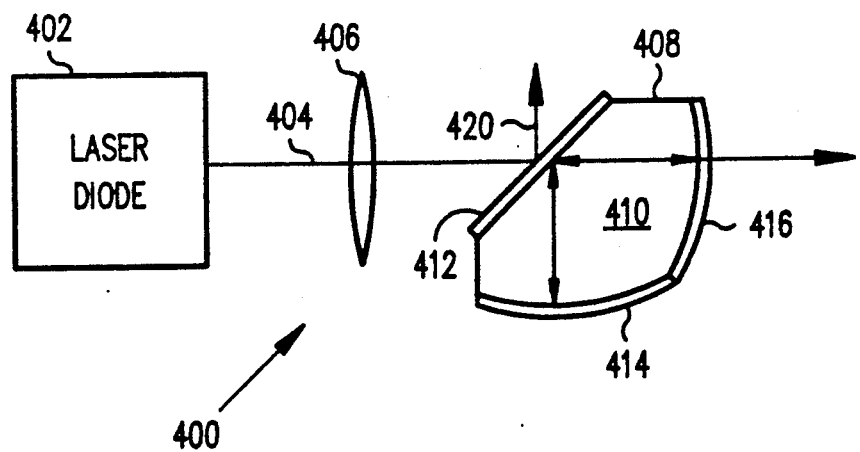
FIG. 5 shows a schematic diagram of an alternative embodiment of the present invention.

FIG. 5 shows a fifth embodiment of the laser system of the present invention and is designated by the general reference number 400. System 400 comprises a laser diode 402 similar to laser 12 of FIG. 1. Laser 402 outputs an FF (infrared) beam of light along an output line 404. A lens 406 and an optical resonator 408 are positioned along line 404. Resonator 408 comprises a nonlinear crystal 410 surrounded by a mirror 412, a mirror 414 and a mirror 416. Mirror 412 is chosen to be highly reflective (greater than 90%) for the SHG light and to have a reflectivity R1 for the FF light. The reflectivity R1 is chosen such that resonator 408 will impedance match laser 402, so that the light reflected directly back from mirror 412 is minimized and the coupled light (light which is trapped in resonator 408) is maximized. Crystal 410 is similar to crystal 30 of FIG. 1. Mirror 414 has a reflectivity of greater or equal to 99% for both FF (infrared) and SHG (blue) light. Mirror 416 has a reflectivity greater or equal to 99% for FF (infrared) light and a transmission of equal to or greater than 95% of blue light. Mirrors 412, 414 and 416 are made by a multilayer dielectric coating process.

The operation of system 400 is similar to that of system 300 of FIG. 4. FF (infrared) light from laser 402 is focussed by lens 406 onto mirror 412 and is spatially mode matched to the light inside resonator 408. A portion of the light is reflected along a line 420. The remaining light passes through mirror 412 into crystal 410. SHG (blue) light exits resonator 408 at mirror 416. Mirror 416 reflects back the FF (infrared) light to mirror 412. Some of this reflected FF (infrared) light passes through mirror 412 to laser 402 and locks the laser to the resonant frequency of the resonator 408. The remaining light is reflected to mirror 414 which in turn reflects the light back to mirror 412.

All of the embodiments shown in FIGS. 2-5 have a beamsplitter, photodetector and tuning circuit (not shown) similar to beamsplitter 50, photodetector 51 and tuning circuit 52 of FIG. 1.

The use of a laser diode with an anti-reflective coating provides several advantages. With a high anti-reflective coating on the facet, the laser diode is no longer a true laser because there is virtually no back reflection from the facet back into the laser to cause the laser to lase. However, the FF (infrared) light returning from the resonator of the present invention provides the reflected light needed to cause the laser to lase. The results is that the entire laser system of the present invention will become very stable. There is no need to match the phase of the feedback light. The use of lasers with anti-reflective facet coatings also minimizes the laser power impinging onto the laser output facet and thereby reduces facet damage.

Mirrors 18, 110, 210, 312 and 416 are all feedback mirrors. These feedback mirrors have high transmission at the SHG wavelength and high reflectivity at the FF wavelength. These feedback mirrors redirect the major portion of the FF light transmitted by the resonator back through the resonator and into the diode laser. The total optical loss experienced by the FF light on this double pass is low (typically less than 10%) even in the case of very efficient frequency doubling of the FF light circulating in the resonator. As a result, more than 50% of the diode laser output power is readily coupled back into the laser by means of the feedback mirror. The present invention thus achieves strong optical feedback to the laser. This is in contrast to the resonator scheme described by Dickson, et al., which teaches total optical feedback of less than 5%. In Dickson, the frequency matching of the diode laser resonator occurs via an optical self-locking effect and the optical feedback does not change the laser threshold gain in any significant way. A strong optical feedback in connection with the anti-reflective coating of the present invention leads to a substantial reduction in the threshold gain of the laser. Since the laser will operate at the condition minimum threshold gain, the laser will automatically adjust its electron density and operating frequency so that its oscillation frequency is matched to the resonant frequency of the resonator. As a result, no active control of the phase of the radiation coupled back from the feedback mirror is required. In contrast, Dickson, et al., requires some sort of phase control.

Other embodiments of the present invention are also possible. For example, different configurations of resonator cavities may be used. Also, different combinations of laser diodes and nonlinear crystals may be used. For example, a Gallium-aluminum-arsenide (GaAlAs) laser diode may be used with a potassium niobate ($KNbO_3$), a lithium niobate ($LiNbO_3$), a periodically-poled lithium niobate ($LiNbO_3$) or a potassium-lithium-niobate ($KLiNbO_3$) nonlinear crystal. A strained-layer indium-gallium-arsenide/gallium-arsenide (InGaAs/GaAs) laser diode may be used with a potassium-titanyl-phosphate ($KTiOPO_4$), a periodically-poled lithium niobate ($LiNbO_3$) potassium niobate ($KNbO_3$) or a lithium diffused niobate ($LiNbO_3$) nonlinear crystal.

Different reflectivities of feedback mirrors could also be used. In the preferred embodiments, feedback mirrors 18, 110, 210, 312 and 416 all have reflectivities of 99% or greater for the FF light. However, the reflectivity could be as low as 80% and the invention would still operate well. The reflectivities could conceivably be as low as 15% and the invention would still function. The laser will still experience a reduced threshold gain because of the anti-reflective coating.

The advantage of the present invention is that it provides a laser diode system which can produce an optimum amount of blue light with a minimum number of elements and without the necessity of a complex feedback system. If a $KNbO_3$ crystal is used in a resonator with finesse F = 60 (corresponding to mirror reflectivities of 95%), a blue light output power of approximately 10 mW would be produced by second harmonic generation of a 50 mW GaAlAs laser diode.

Other types of resonators or cavities may be used in connection with the present invention. The cavity should have its maximum reflection and maximum intracavity power on resonance. In addition, it will be understood that the invention is also useful for other nonlinear optical processes which require frequency locking of a diode laser to a passive cavity, such as sum-frequency generation where one or both of the input signals are derived from a diode laser. Furthermore, the technique is also applicable to frequency locking other sorts of lasers, in addition to diode lasers, to passive cavities.

Figure 6:
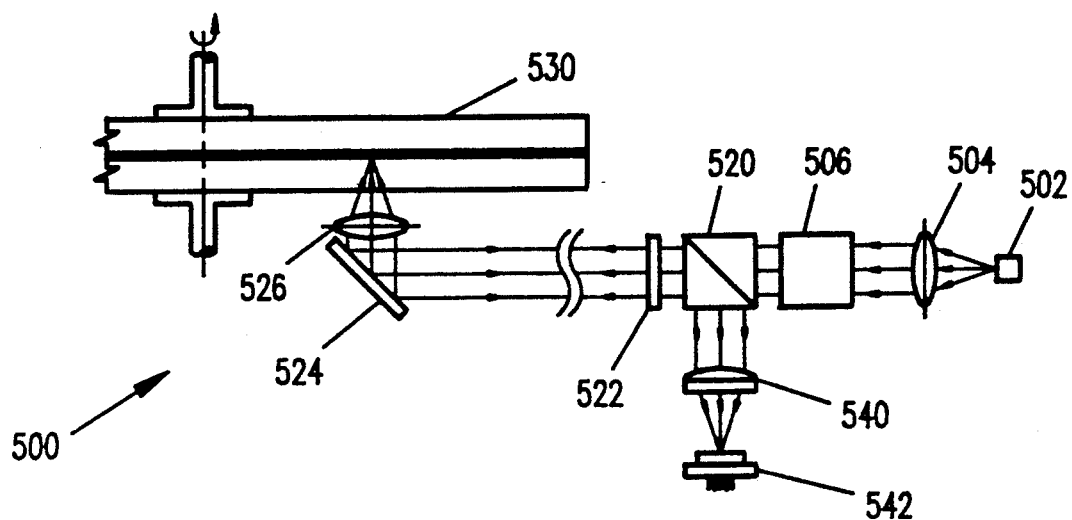
FIG. 6 shows a schematic diagram of a data storage system of the present invention.

FIG. 6 shows a phase change optical data storage system 500 which uses a laser system 502. Laser systems 10, 100, 200, 300 and 400 may be used for system 502. The light from system 502 is collimated by a lens 504 and passes to a circularizing optical element 506. Element 506 emits light having a circular cross-sectional beam pattern. Element 520 may be a prism.

The light then passes through a polarizing beam splitter 510 and a quarter-wave plate 522. The light is reflected off of a mirror 524 and focused by a lens 526 onto an optical recording medium 530. Medium 530 may be a phase change type of optical recording medium.

The light reflected from medium 530 returns through lens 526, is reflected off of mirror 524, passes through plate 522 to beam splitter 520. Reflected light is then diverted by beam splitter 520 to an astigmatic lens 540. Lens 540 focuses the reflected light onto an optical detector 542. The recorded spots of the medium 530 have different reflectivities and these differences are detected by optical detector 542 as data one and zeros. Detector 542 also provides focus and tracking signals.

Figure 7:
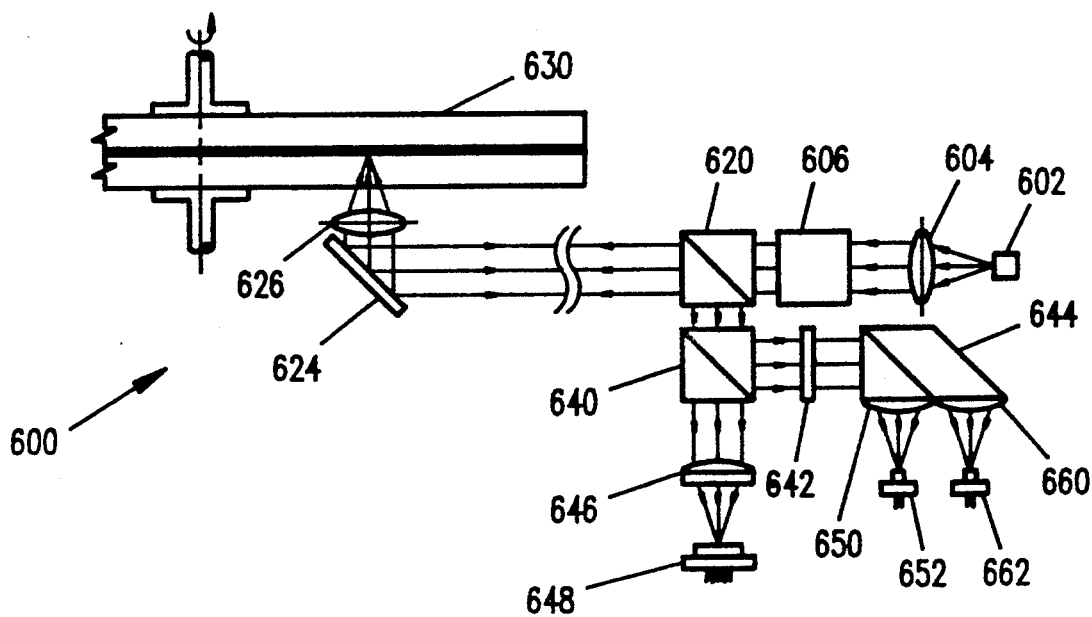
FIG. 7 shows a schematic diagram of an alternative embodiment of a data storage system.

FIG. 7 shows a magneto-optic data storage system 600 which uses a laser system 602. Laser system 10, 100, 200, 300 and 400 may be used for system 602. The light from system 602 is collimated by a lens 604 and passes to a circularizing optical element 606. Element 606 emits light having a circular cross-sectional beam pattern. Element 606 may be a prism.

The light then passes through leaky polarizing beam splitter 620. Beam splitter 620 has reflectivities of Rp greater than zero and Rs approximately equal to 1 (s and p represent the orthogonal polarization components of the light). The light is then reflected off of a mirror 624 to a lens 626 and is focused onto an optical recording medium 630. Medium 630 may be a magneto-optic type of optical recording medium.

The light reflected from medium 630 returns through lens 626, reflects off of mirror 624, and enters beam splitter 620. Beam splitter 620 diverts the reflected light to an amplitude beam splitter 640. Reflected data light is diverted to a half wave plate 642 and to a beam splitter 644. Reflected light of other amplitudes passes straight through beam splitter 640. This light is focused by an astigmatic lens 646 to a quad detector 648 to produce tracking and focus signals.

The medium 630 has recorded spots having either an up or down magnetic domain. The light reflected off of these spots have their plane of polarization rotated one way or the other depending upon the direction of the magnetic domain of the spot. Beam splitter 644 separates the reflected light depending upon which way the plane of polarization has been rotated. The separated beams go to a lens 650 and an optical detector 652 or to a lens 660 and an optical detector 662. The difference in output signals of detectors 652 and 662 are the data ones and zeros. A more detailed explanation of optical disk drive systems is given in "Gradiant-Index Optics and Miniature Optics," SPIE, Vol. 935, p. 63 (1988) by Glenn T. Sincerbox.

While the preferred embodiments of the present invention have been illustrated in detail, it should be apparent that modifications and adaptations to those embodiments ma occur to one skilled in the art without departing from the scope of the present invention as set forth in the following claims.

What is claimed is:

1. A laser system comprising:
   a diode laser having an output facet with a reflectivity of 5% or less for generating a fundamental frequency light;
   a nonlinear crystal in optical communication with the laser for converting fundamental frequency light from the laser to a second harmonic light;
   an optical resonator in which the crystal is located for increasing the power of said second harmonic light; and
   a feedback means in optical communication with the resonator, crystal, and the laser for receiving said fundamental frequency light from the resonator and transmitting said fundamental frequency light to the laser.

2. The system of claim 1, wherein the laser has an anti-reflective facet coating.

3. The system of claim 1, wherein the resonator is a ring resonator having three reflective internal surfaces.

4. The system of claim 1, wherein the resonator comprises a beam splitter and a reflecting mirror.

5. The system of claim 1, wherein the resonator is comprised of two reflective surfaces.

6. The system of claim 1, wherein the resonator is impedance matched to the laser.

7. A method for generating second harmonic light comprising the steps of:
   generating a fundamental frequency light from a laser having an output facet with a reflectivity of 5% or less;
   repeatedly passing said fundamental frequency light through a nonlinear crystal to create a second harmonic light;
   separating said second harmonic light from said fundamental frequency light; and
   passing said fundamental frequency light back through said nonlinear crystal to said laser to lock said laser at said fundamental frequency.

8. A laser system comprising;
   a laser having an output facet with a reflectivity of 5% or less for outputting a beam of fundamental frequency light along an output line;
   a nonlinear crystal located along said output line for converting said fundamental frequency light to a second harmonic frequency light;
   a resonator located along said output line comprising a first mirror located proximate a first side of the crystal and a second mirror located proximate a second side of the crystal; and
   a feedback mirror located along said output line on the opposite side of the resonator from the laser, the feedback mirror for reflecting said fundamental frequency light into the laser along the output line and for allowing said second harmonic light to pass through the feedback mirror.

9. The system of claim 8, wherein the resonator is impedance matched to the laser.

10. A laser system comprising:
    a laser having an output facet with a reflectivity of 5% or less for outputting a beam of fundamental frequency light along an output line;
    a nonlinear crystal located along said output line for converting said fundamental frequency light to a second harmonic frequency light;
    a resonator comprising a first mirror located along said output line proximate a first side of the crystal, a second mirror located on said output line proximate a second side of the crystal, and a third mirror located proximate a third side of the crystal; and
    a feedback mirror located along said output line on the opposite side of the resonator from the laser, the feedback mirror for reflecting said fundamental frequency light back into the laser along the output line and for allowing said second harmonic frequency light to pass through the feedback mirror.

11. The system of claim 10, wherein the resonator is impedance matched to the laser.

12. A laser system comprising:
    a laser having an output facet with a reflectivity of 5% or less for outputting a beam of fundamental frequency light along an output line;
    a resonator comprising a first mirror, a second mirror and a third mirror, said first and second mirror located along said output line;
    a nonlinear crystal located along said output line between said first and second mirror, for converting said fundamental frequency light to a second harmonic frequency light; and a feedback mirror located along said output line on the opposite side of the resonator from the laser, the feedback mirror for reflecting said fundamental frequency light back into the laser along the output line and for allowing said second harmonic frequency light to pass through the feedback mirror.

13. The system of claim 12, wherein the resonator is impedance matched to the laser.

14. A laser system comprising:

a laser having an output facet having a reflectivity of 5% or less for outputting a beam of fundamental frequency light along an output line;

a nonlinear crystal located along said output line for converting said fundamental frequency light to a second harmonic frequency light;

a beam splitter located along said output line between the nonlinear crystal and the laser;

a first mirror located along a line which is perpendicular to said output line, said line intersecting said output line at the beam splitter; and a feedback mirror located along said output line on the opposite side of the nonlinear crystal from the beam splitter, such that the beam splitter, the first mirror and the feedback mirror form a resonator, the feedback mirror for reflecting said fundamental frequency light back into the laser along the output line and for allowing said second harmonic light to pass through the feedback mirror.

15. The system of claim 14, wherein the resonator is impedance matched to the laser.

16. A laser data system comprising:

a laser having an output facet having a reflectivity of 5% or less for generating a fundamental frequency light;

a nonlinear crystal in optical communication with the laser for converting light from the laser to a second harmonic light;

an optical resonator in which the crystal is located for increasing the power of said second harmonic light;

a feedback means in optical communication with the resonator, crystal, and the laser for receiving said fundamental frequency light from the resonator and transmitting said fundamental frequency light to the laser;

an optical recording medium;

an optical transmission means for directing said second harmonic light from the optical resonator to the optical recording medium; and optical reception means for receiving a reflected second harmonic light beam from the optical recording medium and providing a data signal responsive thereto.

17. The system of claim 16, wherein the laser has an anti-reflective facet coating.

18. The system of claim 16, wherein the resonator is a ring resonator having three reflective internal surfaces.

19. The system of claim 16, wherein the resonator comprises a beam splitter and a reflecting mirror.

20. The system of claim 16, wherein the resonator comprises two reflective surfaces.

21. The system of claim 16, wherein the resonator is impedance matched to the laser.

* * * * *